United States Patent
Vanhaelemeersch et al.

(10) Patent No.: US 6,844,267 B1
(45) Date of Patent: Jan. 18, 2005

(54) ANISOTROPIC ETCHING OF ORGANIC-CONTAINING INSULATING LAYERS

(75) Inventors: Serge Vanhaelemeersch, Leuven (BE); Mikhail Rodionovich Baklanov, Leuven (BE)

(73) Assignee: Interuniversitair Micro-Elektronica Centrum (BE)

( * ) Notice: Subject to any disclaimer, the term of this patent is extended or adjusted under 35 U.S.C. 154(b) by 0 days.

(21) Appl. No.: 09/530,069

(22) PCT Filed: Oct. 22, 1998

(86) PCT No.: PCT/BE99/00159

§ 371 (c)(1),
(2), (4) Date: Jul. 3, 2000

(87) PCT Pub. No.: WO99/21217

PCT Pub. Date: Apr. 29, 1999

Related U.S. Application Data

(60) Provisional application No. 60/063,487, filed on Oct. 22, 1997, and provisional application No. 60/074,524, filed on Feb. 12, 1998.

(30) Foreign Application Priority Data

May 18, 1998 (EP) .......................................... 98870111

(51) Int. Cl.$^7$ ........................................... H01L 21/302
(52) U.S. Cl. .................. 438/725; 438/717; 438/723; 438/724; 438/734; 438/700
(58) Field of Search ................ 438/725, 717, 438/723, 724, 734, 700

(56) References Cited

U.S. PATENT DOCUMENTS

| | | | |
|---|---|---|---|
| 3,816,196 A | 6/1974 | La Combe | |
| 4,529,475 A | * 7/1985 | Okano et al. ............... | 156/643 |
| 4,661,204 A | 4/1987 | Mathur et al. | |
| 5,173,442 A | 12/1992 | Carey | |
| 5,176,790 A | 1/1993 | Arleo et al. | |
| 5,269,879 A | 12/1993 | Rhoades et al. | |
| 5,358,902 A | 10/1994 | Verhaar et al. | |
| 5,759,906 A | * 6/1998 | Lou ............................ | 438/623 |
| 5,886,410 A | * 3/1999 | Chiang et al. .............. | 257/759 |
| 5,892,286 A | 4/1999 | Toyoda et al. | |
| 6,162,583 A | * 12/2000 | Yang et al. ................. | 430/313 |
| 6,204,168 B1 | * 3/2001 | Naik et al. .................. | 438/638 |
| 6,492,276 B1 | * 12/2002 | Huang ........................ | 438/700 |

FOREIGN PATENT DOCUMENTS

| | | |
|---|---|---|
| EP | 0 127 188 B1 | 1/1989 |
| JP | 10012617 A2 | 1/1998 |
| RU | 2024991 C1 | 12/1994 |

* cited by examiner

*Primary Examiner*—George A. Goudreau
(74) *Attorney, Agent, or Firm*—Knobbe, Martens, Olson & Bear, LLP

(57) ABSTRACT

A method for forming an opening in an organic insulating layer by covering the insulating layer with a bilayer containing a resist hard mask layer and a resist layer on top of the resist hard mask layer. The bilayer is patterned, and an opening is created by plasma etching the insulating layer in a reaction chamber containing a gas mixture. The plasma etching is controlled so that virtually no etch residues are deposited and so that the side walls of the opening are fluorinated to enhance the anisotropy of the etching. The gas mixture can be a mixture of a fluorine-containing gas and an inert gas, a mixture of an oxygen-containing gas and an inert gas, or a mixture of hydrogen bromide and an additive.

7 Claims, 6 Drawing Sheets

US 6,844,267 B1

ANISOTROPIC ETCHING OF ORGANIC-CONTAINING INSULATING LAYERS

This is the U.S. national phase under 35 U.S.C. § 371 of International Application PCT/BE98/00159, filed Oct. 22, 1998 which claims benefit of Ser. No. 60/063,487 which was filed on Oct. 22, 1997, which claims benefit of Ser. No. 60/074,524 which was filed on Feb. 12, 1998.

FIELD OF THE INVENTION

The present invention is related in the process of semiconductor device fabrication. More in particular, methods including tools and chemistries for anisotropic dry etching of low k polymers are disclosed. These etching processes can be used for definition of via holes and trenches in different interconnect architectures.

BACKGROUND OF THE INVENTION

The ongoing focus on miniaturisation and the increasing complexity and speed requirements of integrated circuits demand for a continuous higher density integration. To achieve this, there is an ongoing downscaling of the dimensions of the active devices as well as of the structures interconnecting these devices, These interconnect structures can comprise multiple metal levels which are, dependent on the aimed interconnect pattern, either separated one from another by means of interlevel insulating layers or connected one to the other by means of a conductive connection through the insulating layer. Intra-level insulating layers are used to provide isolation within a metal level. Besides this downscaling of the dimensions, additional measures are required to be able to meet the stringent speed specifications like e.g. the signal delay. Conventionally the metal levels are Aluminum layers while the insulating layers are oxide layers. In order to reduce the signal delay one can choose a metal layer with a higher conductivity compared to Aluminum, e.g. a Cu-containing metal layer, and/or choose insulating layers with a lower dielectric constant compared to oxide layers.

This demand for insulating layers with a low dielectric constant has lead to an intensified search for new low K materials to be used as insulating layers. A low ∈ material, a low K material and a material with a low permittivity are all alternative expressions for a material with a low dielectric constant, at least for the purposes of this disclosure. The most desirable material should have a low K value, low mechanical stress, high thermal stability and low moisture absorption. Furthermore, the desired material should be selected based on the compatibility with state-of-the-art semiconductor processing steps and tools. Among these new materials are the organic spin-on materials, having a K value in the range from 2.5 to 3, the porous polymers, and the inorganic low-K materials as e.g. xerogels having a K value typically lower than 1.5. The organic materials are of particular interest because they feature simplified processing, excellent gap-fill and planarization.

Nowadays, there are two major ways of fabricating interconnect structures. In the conventional way as a start a conductive layer, e.g. a metal layer, is formed on an insulating layer (or on the substrate) and patterned thereafter usually by means of reactive ion etching (RIE). Another way is the damascene technology. In the damascene technology, first an insulating layer is deposited and patterned and thereafter a metal layer is deposited to fill the openings, eventually followed by a planarization step to remove the metal excess. The damascene technology has the additional advantage that the difficult metal RIE step is avoided. Damascene processing reduces the problem to dry etching of an insulating layer or a stack of insulating layers. This technique allows to build up horizontal metal patterns as well as vertical metal connections in the surrounding insulating layers. These vertical metal connections are required in order to be able to provide a conductive connection between two horizontal metal patterns being processed in different metal levels. To provide such a connection, usually first openings have to be formed in the insulating layer or in the stack of insulating layers between two different metal levels and filled thereafter with a conductive material. Examples of such openings are via holes or contact holes or trenches. To meet the high density integration requirements, the diameter of these openings is continuously decreasing, while at the same time the aspect ratio of these openings is increasing. Due to the small diameter and die high aspect ratios, the creation of these openings, especially the lithographic steps and the etchings steps involved, is a critical process. Therefore, etching of polymers used as insulating layers requires highly anisotropic etching capabilities.

U.S. Pat. No. 5,269,879 is related to the etching of silicon oxide, silicon nitride or oxynitride layers in order to create a via hole extending through such a layer to an underlying electrically conductive layer. Particularly plasma etching is disclosed in an ambient including a fluorine-containing gas, a small amount of a passivating gas, i.e. nitrogen, and eventually an inert gas. This passivating gas is added to the plasma to prevent the sputtering of the underlying electrically conductive layer.

U.S. Pat. No. 5,176,790 is related to the etching of mainly silicon oxide, silicon nitride or oxynitride layers in order to create a via hole extending through such a layer to an underlying electrically conductive layer. Particularly plasma etching is disclosed in an ambient including a fluorine-containing gas, a nitrogen-containing gas, and eventually an inert gas. This nitrogen-containing gas is added to the plasma to prevent the sputtering of the underlying electrically conductive layer. However the amount of nitrogen-containing gas in the ambient is limited. This amount ranges from 1 volume part of nitrogen-containing gas per 2 volume parts of fluorine-containing gas to 1 volume part of nitrogen-containing gas per 15 volume parts of fluorine-containing gas.

SUMMARY OF THE INVENTION

Etching of insulating layers in semiconductor processing requires highly anisotropic etching capabilities in order to be able to create sub 0.5 μm openings such as via holes, trenches and contact holes. A method is disclosed for forming at least one opening in an organic-containing insulating layer formed on a substrate. Preferably, this organic-containing insulating layer comprises at least one unsaturated carbon bond. Examples of organic-containing insulating layer comprising at least one unsaturated carbon bond are organic-containing insulating layers comprising at least one phenyl group. Typical examples are the benzocyclobutarenes, poly arylene ether, aromatic hydrocarbon, and polyimides. These openings are created substantially without depositing etch residues on the exposed layers by plasma etching said insulating layer in a reaction chamber containing a gaseous mixture, said gaseous mixture comprising a fluorine-containing gas and an inert gas Substantially without etch residues means that a limited amount of etch risidues can be formed on the exposed layers but that their composition is such that they can easily be removed selective to the organic-containing insulating layer after the openings have been created in subsequent etch or cleaning steps and that they do not affect the anisotropy of the plasma etching. While the plasma etching proceeds, the process conditions are such that the side walls of the openings are fluorinated which advantageously affects the anisotropy of said plasma etching. To obtain anisotropic plasma etching, preferably the spontaneous etching is negligible, while the etch reaction is effectively stimulated by ion bombardment. In other words, the lateral etch rate should be negligible small compared to the vertical etch rate. Particularly by exposing the side wails of the openings to the fluorine-containing gaseous mixture, the chemical composition of the organic-containing insulating layer at the side walls of the openings is modified. This modification results in an increase of the chemical resistance of the fluorinated part of the organic-containing insulating layer, i.e. at the side walls of the openings thereby enhancing the anisotropy of the plasma etching. Plasma etching includes plasma-assisted dry etching as well as reactive ion etching (RIE). The plasma etching of the organic-containing insulating layer can be performed using a patterned bilayer as an etch mask, said bilayer comprising a resist hard mask layer, being formed on said organic-containing insulating layer, and a resist layer being formed on said resist hard mask layer. Particularly, said resist hard mask layer is a silicon oxide, or a silicon nitride, or a silicon oxynitride layer, or a silicon carbide layer, or a silicon oxycarbide layer. For the purpose of this disclosure a resist hard mask layer is a layer being used as an etch mask layer or an etch stop layer to selectively remove a resist layer. The plasma etching is preferably but not necessarily selective to said resist hard mask layer. The process conditions are such that a highly anisotropic plasma etch is performed featuring substantially no undercut of the hard mask layer and substantially with the conservation of the original hard mask profile.

In an embodiment of the invention, the openings created in the organic-containing insulating layers comprise at least one via hole, said via hole extending through said insulating layer to an underlying conductive layer or a barrier layer. The plasma etching method of the present invention is selective to this underlying layer. In other words excess removal of this underlying layer is prevented. This underlying conductive and/or barrier layer can be a layer of Ti, TiN, Ta, TaN, Co, silicon nitride, silicon carbide, silicon oxycarbide, Pt, W, Al, Cu or an alloy of Al or Cu, or any other low resistivity material.

In another embodiment of the invention, the plasma etching method removes the resist layer during the creation of the openings in the organic-containing insulating layers. However in this case, tie resist hard mask layer has to be a hard mask layer. For the purpose of this disclosure, a hard mask layer is defined as a layer which can be etched selective to the underlying layer, i.e. the organic-containing insulating layer. By doing so, a resist strip after the openings have been created is avoided. Therefore the thickness of the resist layer has to be chosen in accordance with the precise etch conditions and the thickness of die insulating layer. Particularly, this is important when the organic containing insulating layers are silicon-free layers because these silicon-free layers are very sensitive for subsequent etch steps or cleaning steps.

Yet in another embodiment of the invention, the plasma etching method only partly removes the resist layer during the creation of the openings in the organic-containing insulating layers. The thickness of the resist layer is chosen in accordance with the precise etch conditions and the thickness of the organic-containing insulating layer and such that there is still some resist left-over when the openings are created. Afterwards the resist left-over is removed e.g. using a solvent stripper, or an oxygen-containing plasma, or a combination thereof. Particularly this oxygen-containing plasma can be an oxygen plasma. This resist removal can be done substantially without consequences for the side walls of the organic-containing insulating layer at the openings provided that said polymer layer is not too sensitive for said oxygen-containing plasma. A typical example of such a layer which is not too sensitive for an oxygen-containing plasma is a layer selected from the group of the benzocyclobutarenes.

In a further embodiment of the invention, the gaseous mixture in the reaction chamber further comprises an oxygen-containing gas. Examples of such an oxygen-containing gas are $O_2$, CO, $CO_2$ and $SO_2$, but the invention is not limited hereto. By the addition of a small amount of oxygen to the gaseous mixture, the etch rate is increased.

In still a further embodiment of the invention, a method is disclosed for forming at least one opening in an organic-containing insulating layer formed on a substrate. These openings are created substantially without depositing etch residues by plasma etching said insulating layer in a reaction chamber containing a gaseous mixture, said gaseous mixture comprising a fluorine-containing gas. So no inert gas is present in said gaseous mixture.

In a second aspect of the present invention, a method is disclosed for forming at least one opening in an organic-containing insulating layer formed on a substrate. These openings are created by plasma etching said insulating layer in a reaction chamber containing a gaseous mixture, said gaseous mixture comprising a oxygen-containing gas and an inert gas. The ratio between said oxygen-containing gas and said inert gas in said gaseous mixture is chosen such that the spontaneous etch rate is substantially zero. So the use of fluorine is avoided which can be beneficial for the further processing because amongst others, fluorine is known to stimulate corrosion, e.g. especially for Cu this can he an issue.

The plasma etching of the organic-containing insulating layer, according to the present invention, can be performed using a patterned bilayer as an etch mask, said bilayer comprising a hard mask layer, being formed on said organic-containing insulating layer, and a resist layer being formed on said hard mask layer. The plasma etching method has a high selectivity to the hard mask layer formed on the polymer layer. The plasma etch process creates openings in the organic-containing insulating layer and simultaneously selectively removes the resist layer thereby avoiding a resist strip after etching. Preferably, this organic-containing insulating layer is an organic polymer layer with a low K value. Particularly, this organic-containing insulating layer can be a silicon-free polymer layer.

In an embodiment of the invention the oxygen-containing gas in the gaseous mixture is $O_2$ and the inert gas in the gaseous mixture is nitrogen. The ratio of the amount of nitrogen in said gaseous mixture to the amount of oxygen in said gaseous mixture is, preferably in the range from about 10:1 to about 2:1, or from about 30:1 to about 1:1, or from about 50:1 to about 1:1.

In another embodiment of the invention a two-step anisotropic etch process is disclosed, wherein in a first step a first part of an opening is created by means of anisotropic plasma etching using a gaseous mixture comprising a fluorine-containing gas and an inert gas, while in a second step the second part of said opening is etched by means of anisotropic plasma etching using a gaseous mixture comprising an oxygen-containing gas and an inert gas to thereby complete said opening and simultaneously selectively remove the resist.

In a third aspect of the present invention, a method is disclosed for forming at least one opening in an organic-containing insulating layer formed on a substrate. These openings are created by plasma etching said insulating layer in a reaction chamber containing a gaseous mixture, said gaseous mixture comprising HBr and an additive, said additive passivating the exposed parts of the insulating layer, i.e. the side walls. Typical examples of such an additive are an inert gas, like $N_2$, Ar, He, Xe, Krypton or an oxygen-containing gas, like $O_2$, CO, $CO_2$, $N_2O$, $NO_2$, $SO_2$, but the invention is not limited hereto. Preferably, this organic-containing insulating layer is an organic polymer layer with a low K value.

BRIEF DESCRIPTION OF THE DRAWINGS

FIG. 9 represents a SEM picture of trenches in an organic-containing insulating layer (7), i.e. a SILK layer, after a two-step plasma etching according to an embodiment of the invention, showing intact $SiO_2$ layer (8). No undercut of the $SiO_2$ layer can be detected.

DETAILED DESCRIPTION OF THE INVENTION

Figure 1:
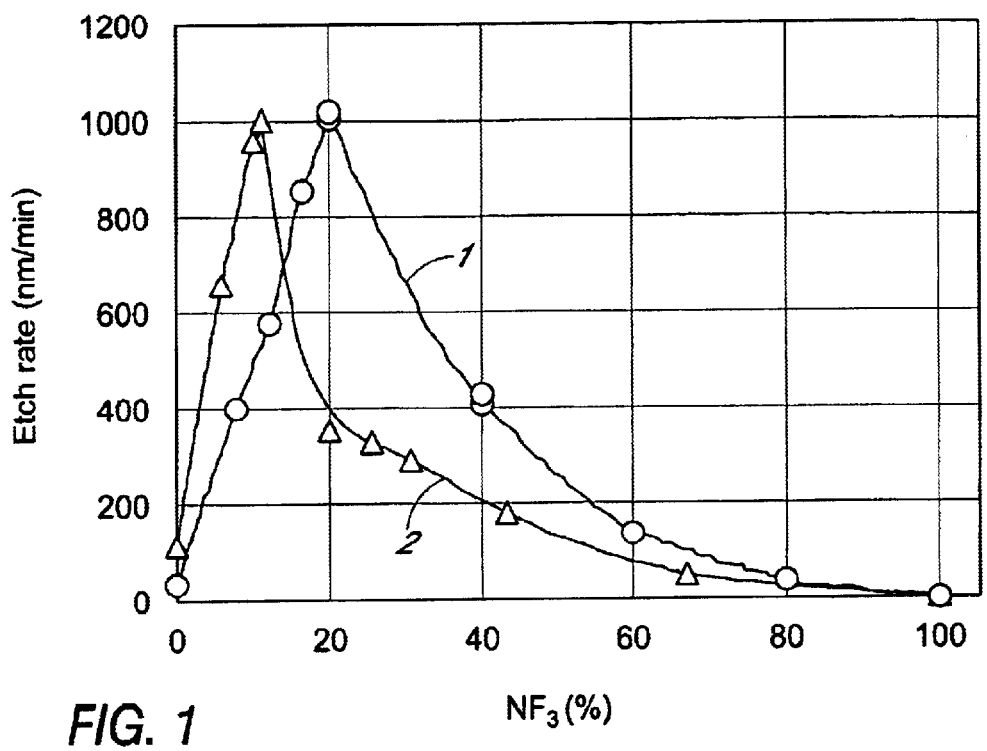
FIG. 1 represents afterglow etch rates of planar SiLK (2) and BCB (1) layers for different $NF_3/O_2$ flow ratios.

In relation to the appended drawings the present invention is described in detail in the sequel. It is apparent however that a person skilled in the art can imagine several other equivalent embodiments or other way of executing the present invention, the spirit and scope of the present invention being limited only by the terms of the appended claims.

In a first aspect of the present invention, a method is disclosed for forming at least one opening in an organic-containing insulating layer formed on a substrate. These openings are created substantially without depositing etch residues by plasma etching said insulating layer in a reaction chamber containing a gaseous mixture, said gaseous mixture comprising a fluorine-containing gas and an inert gas. Preferably, this organic-containing insulating layer comprises at least one unsaturated carbon bond. Examples of organic-containing insulating layer comprising at least one unsaturated carbon bond are organic-containing insulating layers comprising at least one phenyl group. Typical examples are the benzocyclobutarenes, e.g. Cyclotene 5021™ from Dow Chemical with chemical formulation divinyl siloxane benzocyclobutanie (BCB), poly arylene ether, e.g. FLARE™ II, aromatic hydrocarbon, e.g. SILK™. The substrate can be a partly processed or a pristine wafer or slice of a semi-conductive material, like Si or Ga As or Ge, or an insulating material, e.g. a glass slice, or a conductive material. Said substrate can comprise a patterned conductive layer. Particularly, in case said substrate is a partly processed wafer or slice; at least a part of the active and/or passive devices can already be formed and/or at least a part of the structures interconnecting these devices can be formed.

To obtain anisotropic plasma etching, preferably the spontaneous etching is limited or negligible, while the etch reaction is effectively stimulated by ion bombardment. In other words, the lateral etch rate should be negligible small compared to the vertical etch rate. Particularly by exposing the side walls of the openings, i.e. the surface of the organic-containing insulating layer comprising at least one phenyl group at these side walls of these openings, to the fluorine-containing gaseous mixture during the plasma etching, these side walls are fluorinated which advantageously affects the anisotropy of said plasma etching. By doing so, the chemical composition of the organic-containing insulating layer comprising at least one unsaturated carbon bond is modified at the side walls of the openings. Particularly, organic-containing insulating layers comprising phenyl groups contain such unsaturated carbon bonds. These carbon bonds, which can be attacked by reactive species such as atomic fluorine generated in a plasma or another ambient comprising active fluorine. Said active fluorine can abstract hydrogen from carbon in said phenyl groups. Therefore, the method involves a formal replacement of hydrogen by fluorine. Furthermore, due to the small size of the fluorine atoms, they can easily diffuse through the insulating layer. Consequently the replacement of hydrogen by fluorine is not limited to the surface of the layer but can extend also further in the layer. Fluorine is the most electronegative and the least polarizable element on the periodic table. The incorporation of fluorine in the insulating layer at the side walls of the openings makes the fluorinated part of the insulating layer less polarizable leading to an increase in chemical resistance and a decrease of the K value of said part, said part starts at a surface and extends in the insulating layer with elapsing exposure time. So particularly, this in-situ fluorination results in an increase of the chemical resistance of the fluorinated part of the organic-containing insulating layer, i.e. at the side walls of the openings thereby enhancing the anisotropy of the plasma etching. It should be clear however that during the plasma etching the bottom side of the openings, i.e. a surface of the insulating layer at the etch front of the opening is also exposed to the gaseous mixture comprising fluorine. But contrary to the side walls, at the bottom side of the openings fluorination is prevented or at least the effect of the fluorination is nullified by the ion bombardment. Plasma etching includes plasma-assisted dry etching as well as reactive ion etching (RIE). The plasma etching of the organic-containing insulating layer can be performed using a patterned bilayer as an etch mask, said bilayer comprising a resist hard mask layer, being formed on said organic-containing insulating layer and a resist layer being formed on said hard mask layer. Particularly, said resist hard mask layer can be a silicon oxide, or a silicon nitride, or a silicon oxynitride, or a silicon carbide, or a silicon oxycarbide. By doing so a highly anisotropic plasma etch is performed featuring substantially no undercut of the resist hard mask layer and with the conservation of the original resist hard mask profile.

The pressure in the reaction chamber is typically between 1 mTorr and 100 mTorr, or between 1 mTorr and 300 mTorr, or between 1 mTorr and 5 Torr. The setting temperature is typically between −10° C. and 50° C. −30° C. and 50° C., or −60° C. and 70° C. This setting temperature is the temperature as set on the heating/cooling source. The actual temperature in the reaction chamber can be higher dependent on the plasma conditions, Typical examples of fluorine-containing gases are $SF_6$, of $NF_3$, or $C_2F_6$, or $CF_4$ or $CHF_3$ or $CH_3F$ or $CH_2F_2$ or mixtures thereof. The inert gas can be helium or argon or krypton or nitrogen or xenon or krypton. The inert gas is preferably nitrogen. More preferably, the ratio of the amount of nitrogen in said gaseous mixture to the amount of fluorine-containing gas in said gaseous mixture is larger than 2:1.

In case the opening is a via hole, the plasma etching is performed until the surface of an underlying conductive layer or an underlying barrier layer is reached while preventing excess removal of the underlying layer. This underlying conductive and/or barrier layer can be a layer of Ti, TiN, Ta, TaN, Co, silicon nitride, silicon carbide, silicon oxycarbide, Pt, W, Al, Cu or an alloy of Al or Cu, or any other low resistivity material.

Figure 5:
FIG. 5 represents a SEM picture of the via holes in an organic-containing insulating layer (7), i.e. a BCB layer, after plasma etching according to an embodiment of the invention in an ambient comprising $SF_6$ and $N_2$. The picture shows a $SiO_2$ layer (8), remaining resist (9), intact Ti/TiN barrier layer (6) on a conductive AlSiCu layer (5). Layer (4) is again a Ti/TiN barrier layer. No undercut of the $SiO_2$ layer can be detected.

As an example, an anisotropic plasma etch process to create openings in a BCB layer is disclosed.
Experimental Conditions are:
  etch tool: high density plasma reactor (TCP 9400)
  gaseous mixture for the plasma etch: $SF_6$ and $N_2$
  etch conditions in chamber: 15 mTorr
  TCP power: 700 watt
  bottom power: 100 watt
  hard mask layer is a PECVD oxide layer with a thickness of 250 nm
  thickness of the resist layer (Sumitomo I-line resist): 1.2 $\mu$m
  thickness of BCB layer: 0.7 $\mu$m
  underlying layer: TiN layer
  set-point temperature: 20° C.
Under these conditions the BCB layer was etched with an etch rate of 500 nm/min, yielding a highly anisotropic etch profile and substantially no hard mask undercut (FIG. 5). Furthermore the resist hard mask profile was kept intact and there was substantially no TiN loss. When reaching the surface of the TiN layer the thickness of the remaining resist leftovers was about 0.1 $\mu$m. These resist left-overs can be removed by a subsequent etching step without attacking the other materials present on the wafer, particularly the BCB. Then, eventually, a cleaning step can be performed using diluted $H_2SO_4$ to remove the residues without attacking the other materials present on the wafer. Alternatively, instead of $H_2SO_4$ EKC 265 or a combination of $H_2SO_4$ and EKC 265 can be used.

With this etch chemistry, resist hard mask undercut is prevented due to the fluorination of at least a part of the BCB layer. This fluorination is obtained by exposure of the side walls of the BCB layer to an ambient comprising fluorine. Said fluorination increases the chemical and mechanical resistance of said BCB as clearly supported by FIGS. 1, 2 and 3.

Figure 2:
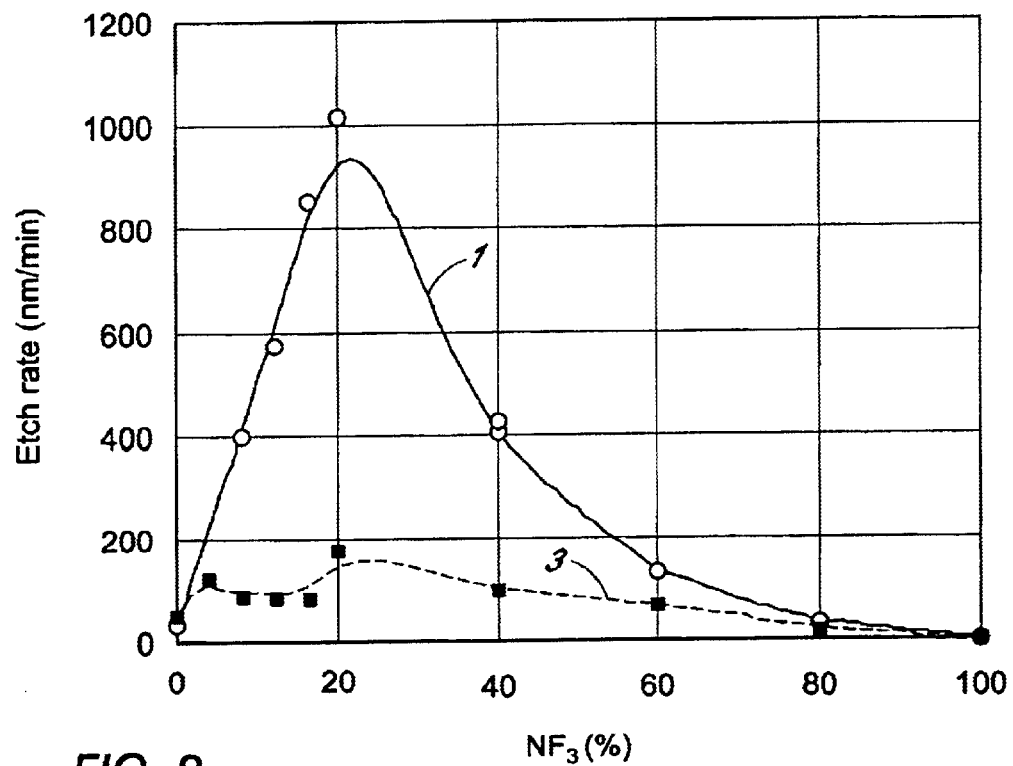
FIG. 2 represents, according to an embodiment of the invention, the etch rate of BCB (Cyclotene 5021™) in a plasma ambient comprising a mixture of $NF_3$, $O_2$ and He versus the percentage of $NF_3$. The total gas flow was 115 sccm, whereas die pressure in the chamber was 1.30 Torr. The He flow was kept constant and equal to 65 sccm. The flows of $NF_3$ and $O_2$ were chosen complementary and were varied between 0 and 50 sccm, whereby the sum of the $NF_3$ flow and the $O_2$ flow was kept constant and equal to 50 sccm. The percentage of $NF_3$ in the figure is the relative amount of $NF_3$ compared to the amount of $NF_3$ and $O_2$ without taking into account He.
Figure 3:
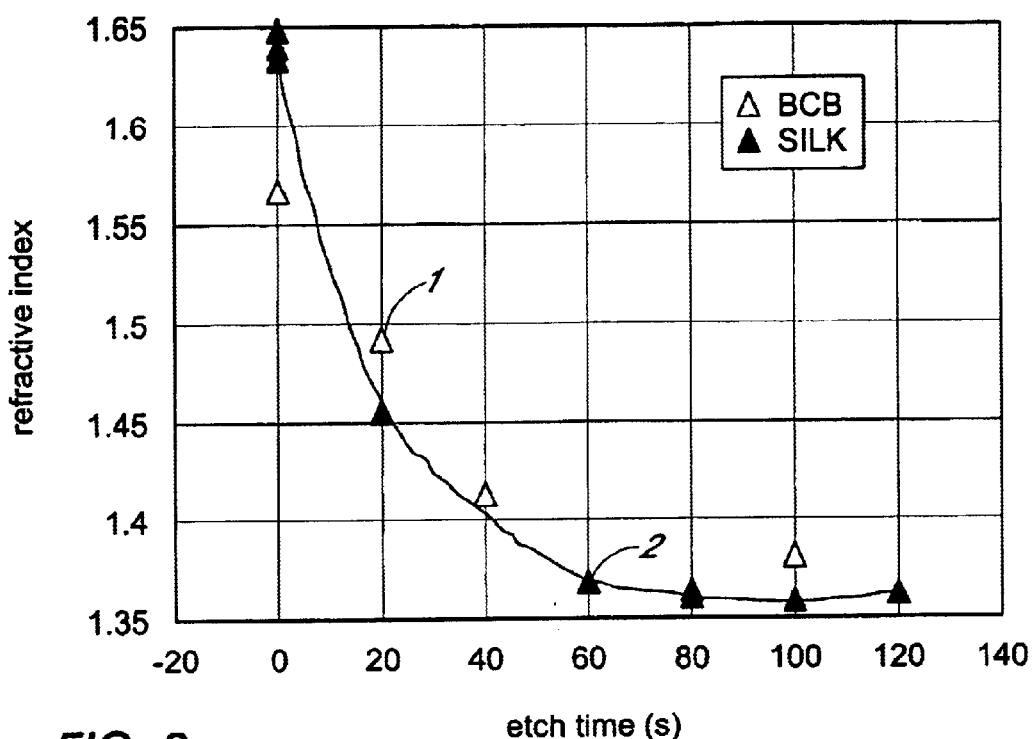
FIG. 3 represents the change in refractive index of SiLK and BCB as a function of etch time in a $NF_3$ afterglow plasma.
Figure 4:
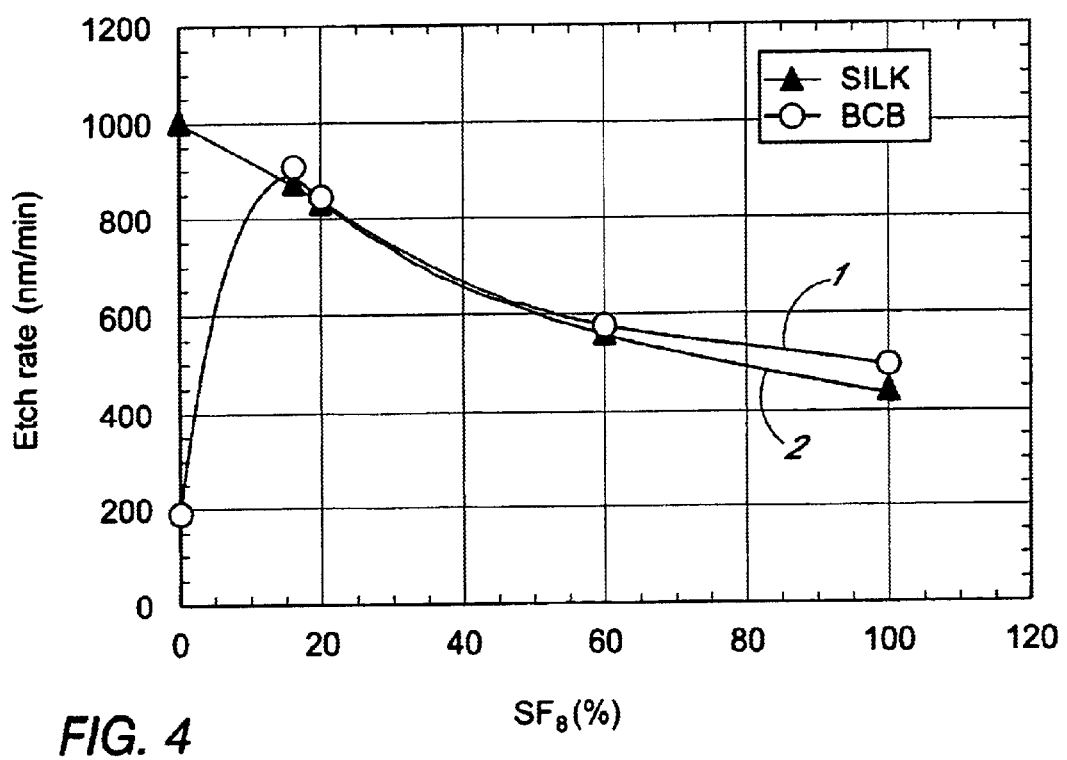
FIG. 4 represents etch rates of SiLK and BCB in RIE conditions with changing $SF_6/O_2$ gas flow ratios (0=pure $O_2$ diluted in $N_2$, 100=pure $SF_6$ diluted in $N_2$).

FIG. 1 shows the etch rate of a planar BCB layer (1) and a SILK layer (2) under afterglow conditions, i.e. without ion bombardment, in a gaseous mixture comprising a fluorine-containing gas, being $NF_3$, and an oxygen-containing gas, being $O_2$. It is observed that the etch rate in pure fluorine-containing plasma is substantially zero. It is also observed that this exposure affects only a part of the layer, said part starting at the exposed surface of the layer and extending into the layer. The thickness of said fluorinated part of the film depends on the atomic fluorine concentration, the fluorination time, i.e. the exposure time, and the temperature. This observation confirms the expectations because the fluorination is a diffusion limited process. The fluorination of said part of the BCB layer, leads to a change of refractive index and chemical composition of said fluorinated part of the BCB layer. This is also observed for SILK films and Flare-II films. As depicted in FIG. 2, the etch rate for etching a fluorinated BCB film (3) in a $O_2/NF_3$ afterglow plasma can be substantially lower than the etch rate for etching pristine BCB films (1), dependent on the $O_2/NF_3$ ratio. The change of the refractive index (FIG. 3) is also indicative for the fluorination of the BCB layer under pure $NF_3$ afterglow conditions. Lowering of the refractive index results in a lowering of the K-value. From these observations in an afterglow plasma, one can conclude that lateral etching in a plasma etch process, e.g. RIE, can be controlled by the choice of the tight process chemistry. The vertical etch rate however will be higher in RIE as compared to afterglow because energy is still provided to the surface by means of ion bombardment. The vertical etch rates obtained in RIE for $SF_6/N_2$ chemistries are shown in FIG. 4. From the figures, one can conclude that working under oxygen free etch conditions allows sufficient etch rate (vertical) with substantially zero etch rate in the lateral direction.

Figure 7:
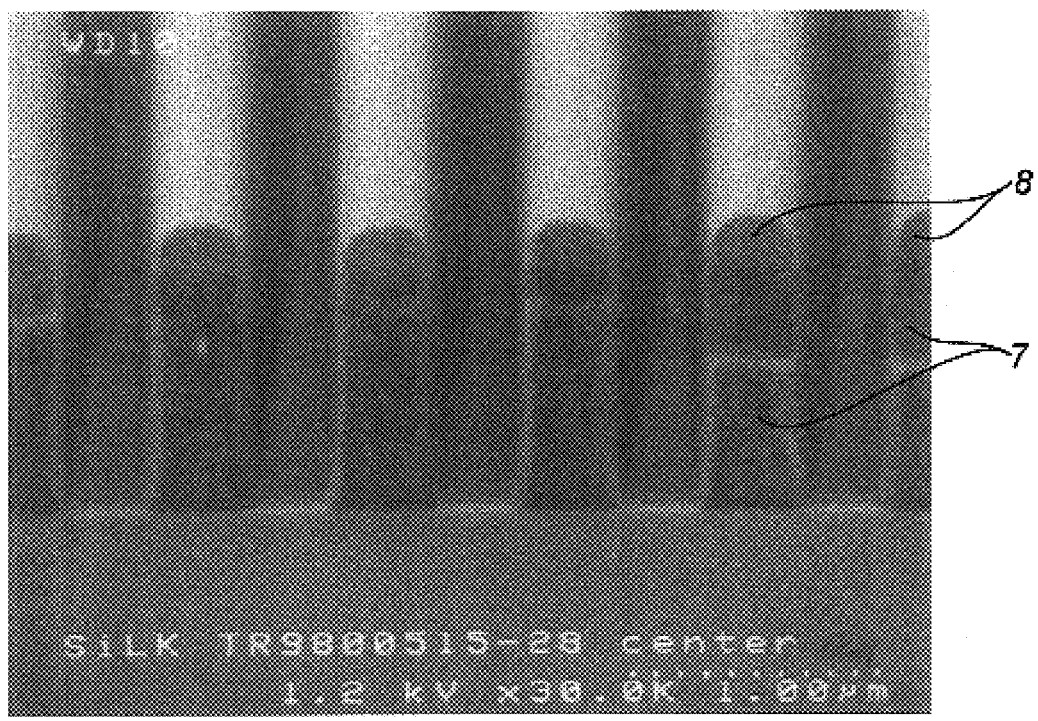
FIG. 7 represents a SEM picture of trenches in an organic-containing insulating layer (7), i.e. a SILK layer, after plasma etching according to an embodiment of the invention in an ambient comprising $N_2$ and $O_2$ at a ratio of 5:1, showing intact $SiO_2$ layer (8). No undercut of the $SiO_2$ layer can be detected.
Figure 8A:
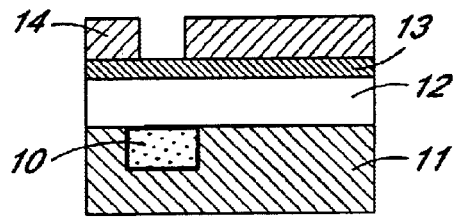
Figure 8B:
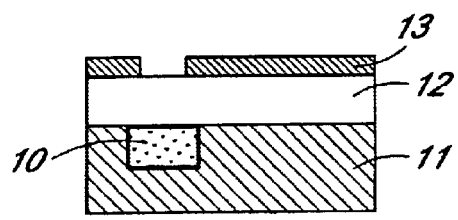
Figure 8C:
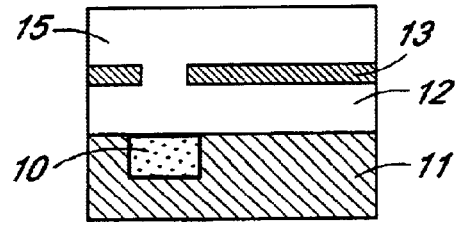
Figure 8D:
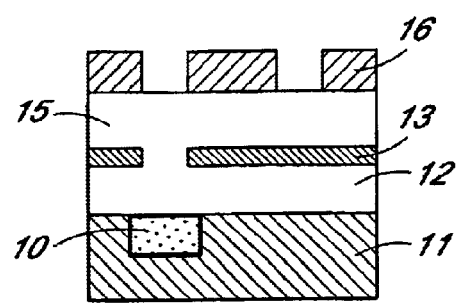
Figure 8E:
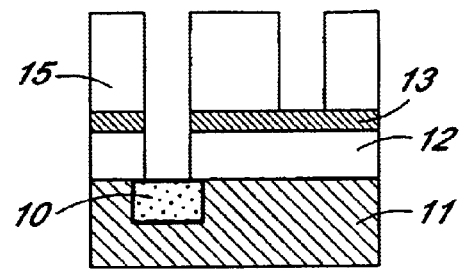
Figure 8F:
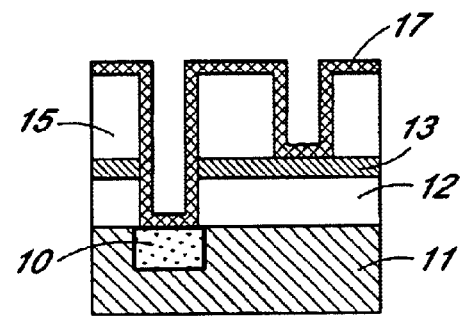
Figure 8G:
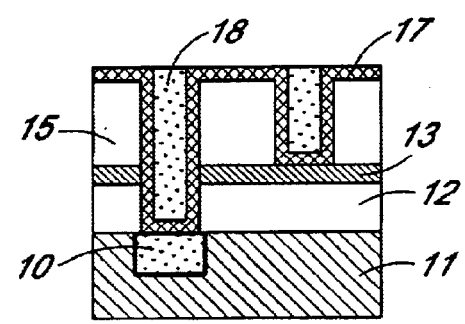

In a second aspect of the present invention, a method is disclosed for forming at least one opening in an organic-containing insulating layer formed on a substrate. These openings are created by plasma etching said insulating layer in a reaction chamber containing a gaseous mixture, said gaseous mixture comprising a oxygen-containing gas and an inert gas. Preferably, this organic-containing insulating layer is a low K polymer layer. Particularly, this organic-containing insulating layer can be a silicon-free polymer layer. Typical examples are poly arylene ether, i.e FLARE™ II, aromatic hydrocarbon, i.e. SILK™. To obtain anisotropic plasma etching, preferably the spontaneous etching is limited or negligible, while the etch reaction is effectively stimulated by ion bombardment. In other words, the lateral etch rate should be negligible small compared to the vertical etch rate. As can be deduced from FIG. 1 the spontaneous etch rate of a planar SILK layer (2) and a planar BCB layer (1) under afterglow conditions, i.e. without ion bombardment, in a pure oxygen ambient is, although below 100 nm per minute, far too high making such a pure oxygen ambient unsuited for anisotropic plasma etching. However, by introducing an appropriate amount of an inert gas the spontaneous etching rate can be reduced to substantially zero. The plasma etching of the organic-containing insulating layer, according to the present invention, can be performed using a patterned bilayer as an etch mask, said bilayer comprising a hard mask layer, being formed on said organic-containing insulating layer, and a resist layer being formed on said hard mask layer. The plasma etching method has a high selectivity to the hard mask layer formed on the polymer layer. Particularly, said hard mask layer can be a silicon oxide, or a silicon nitride, or a silicon oxynitride, or a silicon carbon, or a silicon oxycarbon layer. The plasma etch process creates openings in the organic-containing insulating layer and simultaneously removes the resist layer thereby avoiding a resist strip after etching. By doing so a highly anisotropic plasma etch is performed featuring substantially no undercut of the hard mask layer, selective to the hard mask layer and with the conservation of the original hard mask profile. Preferably (FIG. 7), the side walls of the openings are slightly positively sloped yielding a better performance and reliability in the subsequent processing steps, as e.g. filling the opening with a metal.

The pressure in the reaction chamber is typically between 1 mTorr and 100 mTorr, or between 1 mTorr and 300 mTorr, or between 1 mTorr and 5 Torr. The setting temperature is typically between −10° C. and 50° C., −30° C. and 50° C. or −60° C. and 70° C. This setting temperature is the temperature as set on the heating/cooling source. The actual temperature in the reaction chamber can be higher dependent on the plasma conditions. Preferably the oxygen-containing gas is $O_2$ but the invention is not limited hereto. The inert gas can be helium or argon or krypton or xenon or nitrogen. The inert gas is preferably nitrogen. More preferably, the ratio of the amount of nitrogen in said gaseous mixture to the amount of oxygen in said gaseous mixture is in the range from 10:1 to 2:1 or from 30:1 to 1:1.

In case the opening is a via hole, the plasma etching is performed until the surface of the underlying conductive layer or the underlying barrier layer is reached while preventing excess removal of the underlying layer. This underlying conductive and/or barrier layer can be a layer of Ti, TiN, Ta, TaN, Co, silicon nitride, silicon carbide, silicon oxycarbide, Pt, W, Al, Cu or an alloy of Al or Cu, or any other low resistivity material.

In an embodiment of the invention, as an experimental example, an anisotropic etch process on a silicon-free polymer layer, i.e. a SILK layer is disclosed.

Experimental Conditions are:
 etch tool: high density plasma reactor (TCP 9100)
 gaseous mixture for the plasma etch: $O_2$ and $N_2$
 etch conditions in chamber: 5 mTorr
 TCP power: 400 watt
 bottom power: 200 watt
 hard mask layer is a PECVD oxide layer with a thickness of 250 nm
 thickness of the resist layer (Sumitomo I-line): 1.2 μm
 thickness of SILK layer: 1.1 μm
 underlying layer: TiN layer
 set-point temperature: 20° C.

Figure 6:
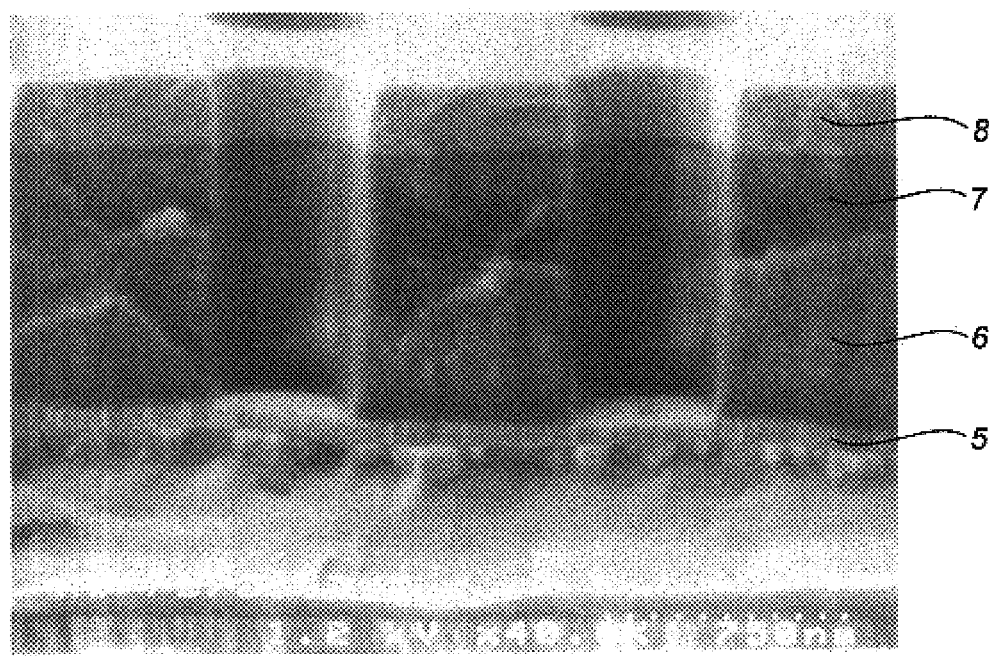
FIG. 6 represents a SEM picture of via holes in an organic-containing insulating layer (7), i.e. a SILK layer, after plasma etching according to an embodiment of the invention in an ambient comprising $O_2$ and $N_2$, showing intact $SiO_2$ layer (8), intact Ti/TiN barrier layer (6) on a conductive AlSiCu layer (5). No undercut of the $SiO_2$ layer can be detected.

Under these conditions the SILK layer was etched with an etch rate of 500 nm/min, yielding via holes (FIG. 6) with a highly anisotropic etch profile and substantially no hard mask undercut. Furthermore the hard mask profile was kept intact and there was substantially no TiN loss. When reaching the surface of the TiN layer the resist layer was totally removed. Then a cleaning step was performed using diluted $H_2SO_4$ to remove the residues without attacking the other materials present on the wafer. Alternatively, instead of $H_2SO_4$ EKC 265 or a combination of $H_2SO_4$ and EKC 265 or an SPM solution can be used.

Figure 9:
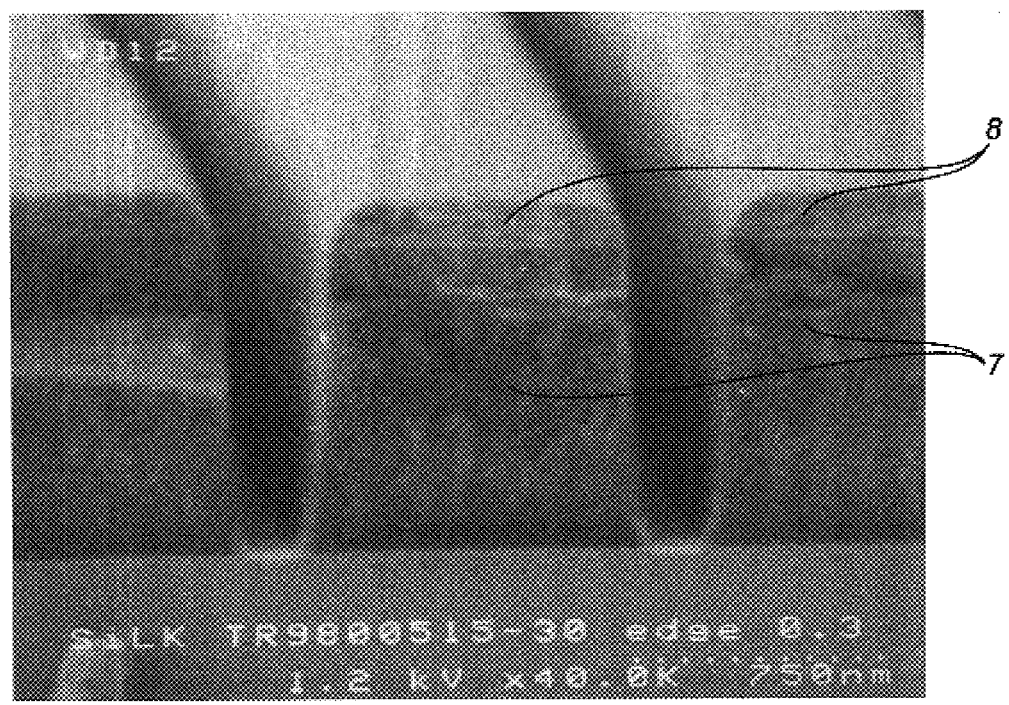
FIG. 9 represents, according to an embodiment of the invention, a detailed description of the processing steps involved to create a particular interconnect structure, i.e. a dual-damascene structure.

In another embodiment of the invention, prior to the step of anisotropic plasma etching of an organic-containing insulating layer in an ambient comprising an oxygen-containing gas and an inert gas, a first part of an opening is created in said organic-containing insulating layer by plasma etching in an ambient comprising a fluorine-containing gas and an inert gas. In fact a two-step anisotropic etch process is disclosed (as in FIG. 9) wherein in a first step a first part of an opening is created by means of anisotropic plasma etching using a gaseous mixture comprising a fluorine-containing gas and an inert gas, while in a second step the second part of said opening is etched by means of anisotropic plasma etching using a gaseous mixture comprising an oxygen-containing gas and an inert gas to thereby complete said opening and simultaneously selectively remove the resist. The openings formed by this two-step etch process have slightly positively sloped side walls. As an example (FIG. 8), a particular dual-damascene structure is described. During the fabrication of such a structure the method of the present invention is utilised. It should be clear however that the invention is not limited to this particular structure but the present invention can be applied for any isolation or interconnect structure comprising organic-containing insulating layers wherein openings have to be created. According to the example (FIG. 8):

A first dielectric layer (12), i.e. an organic polymer layer comprising phenyl groups is formed on a substrate (11) comprising a patterned conductive layer (10). Said conductive layer can be a single conductive layer or a combination of a conductive layer and a barrier layer. Examples of such polymers are the benzocyclobutarenes, i.e. benzocyclobutene (BCB) commercially available as Cyclotene 5021™, poly arylene ether, i.e FLARE™ II, aromatic hydrocarbon, i.e. SILK™, polyimides.

A first hard mask layer (13), e.g. a silicon oxide or a silicon nitride or a silicon oxynitride layer or a SiC layer, is formed on this organic polymer film. Then a patterned resist layer (14) is formed thereon (FIG. 8, step a)). Further, said first hard mask layer is patterned (FIG. 6, step b)) using said patterned resist layer as a mask and said second resist layer is removed.

A second dielectric layer, i.e. an organic-containing insulating layer comprising at least one phenyl group (15), is formed (step c)) on the patterned first hard mask layer. A patterned bilayer (16) is formed (step d)) on said second dielectric layer, This bilayer comprises a second hard mask, layer, being formed on said second dielectric layer, and a second resist layer being formed on said second hard mask layer.

The first and the second dielectric layer can be etched by means of the anisotropic plasma etching method of the present invention. There are at least two possibilities.

As a first possibility, a first part of the openings can be formed by plasma etching said second dielectric layer in a gaseous mixture comprising a fluorine containing gas and an inert gas using the patterned bilayer as an etch mask which can result in the formation of a first part of a trench and a first part of a via hole. In such case, the first hard mask layer not necessarily functions as an etch stop layer. The thickness of the second resist layer is chosen in accordance with the etch time such that when this first timed etch is stopped there is still some resist left and said first hard mask layer is not yet reached. Thereafter the etch in, said second dielectric layer is continued by plasma etching in a gaseous mixture comprising an oxygen-containing gas and an inert gas. This second etch is selective to said, first and said second hard mask layer thereby preventing the extension from the trench in the first dielectric layer (step e)). The first dielectric layer is then etched in a gaseous mixture comprising an oxygen-containing gas and an inert gas using the patterned first hard mask layer as a mask to form a via hole i.e. exposing the surface of the underlying conductive layer (step e)).

As a second possibility, the openings can be formed by plasma etching said second dielectric layer in a gaseous mixture comprising an oxygen-containing gas and in inert gas using the patterned bilayer as an etch mask. This etch is selective to said first and said second hard mask layer thereby preventing the extension from the trench in the first dielectric layer (step e)). The first dielectric layer is then etched in a gaseous mixture comprising an oxygen-containing gas and an inert gas using the patterned first hard mask layer as a mask to form a via hole i.e. exposing the surface of the underlying conductive layer (step e)). The etching of the first and second dielectric layer can be performed using a single etch step or two subsequent etch steps.

Both possibilities have the common advantage that the second resist layer is completely and selectively removed.

Thereafter said second hard mask layer can be removed (as in FIG. 8 step e)) or not.

A conductive layer, e.g. an alloy of or pure Al, Cu, Ag, Pt, Co, Ti, Ni or Au, or a combination of a conductive layer (18) and a barrier layer (17), like e.g. a Ti-containing layer or a Co-containing or a Ni-containing layer or a Ta-containing layer, can be deposited (steps f) and g)) thereby filling the via hole in the first and second dielectric layer and the trench in the second dielectric layer.

In a third aspect of the present invention, a method is disclosed for forming at least one opening in an organic-containing insulating layer formed on a substrate. These openings are created by plasma etching said insulating layer in a reaction chamber containing a gaseous mixture, said gaseous mixture comprising HBr and an additive, said additive passivating the exposed parts of the insulating layer, i.e. the side walls. Typical examples of such an additive are an inert gas, like $N_2$, Ar, He, Xe, krypton or an oxygen containing gas, like $O_2$, CO, $CO_2$, $N_2O$, $NO_2$, $SO_2$, but the invention is not limited hereto. In fact, a wide variety of additives can be used for increasing the etch rate and/or for additional side wall passivation possibly resulting in positively sloped profiles. In an embodiment of the invention, said gaseous mixture can further comprise fluorine-containing gases in order to increase the etch rate while keeping the selectivities and profiles substantially unchanged by balancing the gas flows.

In another embodiment of the invention, said gaseous mixture can further comprise chlorine-containing gases in order to increase the etch rate while keeping the profiles substantially unchanged and allowing a slight decrease of the selectivities by balancing the gas flows.

The organic-containing insulating layer can be plasma etched using the combination of a patterned hard mask layer and a patterned resist layer as an etch mask by means of plasma etching. The organic-containing insulating layer can be a polymer layer preferably having a low permittivity. Particularly also silicon-containing polymer, layers can be used. The pressure in the chamber is typically between 1 mTorr and 50 mTorr or between 1 mTorr and 5 Torr. By doing so a highly anisotropic etch is performed featuring substantially no undercut of the hard mask layer, selective to the hard mask layer and with the conservation of the original hard mask profile. Furthermore, in case said opening is a via hole, this highly anisotropic etch is selective to the underlying conductive layer or barrier layer.

Particularly, towards the silicon-containing polymers, HBr will help in obtaining higher etch rates by generating SiBr etch products which can be volatilized by means of ion bombardment. At the same time, lateral etching will be substantially inhibited by the formation of $Si_xBr_yO_z$ passivation layers, x, y and z being positive whole numbers. Possibly also C can be incorporated in these passivation layers. These passivation layers are stable as long as there is no exposure to ion bombardment. Particularly, the side walls of the via holes and/or trenches are not exposed to such an ion bombardment. The plasma etch process will have a very high selectivity towards hard mask materials allowing the resist to be removed during the etch process will conservation of the hard mask thickness and profile. As a consequence, this process will allow much thinner hard masks to be used for the formation of via holes and/or trenches. Selectivity both to the hard mask layer and to the underlying conductive layer can be obtained by controlling the ion energy.

Towards the silicon-free polymers, this plasma etch process will allow improved profiles because of the limited lateral etch rate. This will allow high over-etch times whenever needed. The plasma etch process will have a very high selectivity towards hard mask materials allowing the resist layer to be removed during the etch process with conservation of the hard mask thickness and profile. As a consequence, this process will allow much thinner hard mask layers to be used for the formation of via holes and/or trenches. Selectivity both to hard mask layer and eventually to the underlying conductive layer can be obtained by controlling the ion energy.

What is claimed is:

1. A method for forming at least one opening in an organic-containing insulating layer comprising the step of:
   covering said organic-containing insulating layer with a bilayer, said bilayer comprising a resist hard mask layer, being formed on said organic-containing insulating layer, and a resist layer being formed on said resist hard mask layer,
   patterning said bilayer, and
   creating said opening by plasma etching said organic-containing insulating layer in a reaction chamber containing a gaseous mixture, said gaseous mixture comprising an oxygen-containing gas and an inert gas, said inert gas and said oxygen-containing gas being present in said gaseous mixture at a ratio of from 30:1 to 1:1.

2. A method as recited in claim 1, wherein said organic-containing insulating layer is a low K organic polymer layer.

3. A method as recited in claim 1, wherein said resist layer is selectively removed from said hard mask layer while creating said opening.

4. A method as recited in claim 1, wherein said oxygen-containing gas in said gaseous mixture is $O_2$ and said inert gas in said gaseous mixture is nitrogen.

5. A method as recited in claim 4, wherein said ratio of nitrogen in said gaseous mixture to oxygen in said gaseous mixture is in the range from 5:1 to 2:1.

6. A method as recited in claim 2, wherein prior to plasma etching in said reaction chamber containing said gaseous mixture, a first part of said opening is created by plasma etching said insulating layer in said reaction chamber containing a first gaseous mixture, said first gaseous mixture comprising a fluorine-containing gas and an inert gas;

controlling said plasma etching in said reaction chamber containing said first gaseous mixture while creating said first part of said opening, in a manner that substantially no etch residues are deposited and that the side walls of said first part of said opening are fluorinated during said plasma etching to thereby enhance the anisotropy of said plasma etching in said reaction chamber containing said first gaseous mixture.

7. A method as recited in claim 6, wherein said opening has positively sloped side walls.

* * * * *